US010193367B2

(12) United States Patent
Abi Abdallah et al.

(10) Patent No.: US 10,193,367 B2
(45) Date of Patent: Jan. 29, 2019

(54) METHOD AND DEVICE FOR DETERMINING VOLTAGES AND/OR POWERS AVAILABLE IN AN ELECTRICAL RECHARGING NETWORK

(71) Applicant: Institut MINES TELECOM, Paris (FR)

(72) Inventors: Fadi Abi Abdallah, Metn (LB); Maurice Gagnaire, Chatou (FR)

(73) Assignee: INSTITUT MINES TELECOM, Paris (FR)

( * ) Notice: Subject to any disclaimer, the term of this patent is extended or adjusted under 35 U.S.C. 154(b) by 214 days.

(21) Appl. No.: 15/314,713

(22) PCT Filed: Jun. 2, 2015

(86) PCT No.: PCT/EP2015/062277
§ 371 (c)(1),
(2) Date: May 2, 2017

(87) PCT Pub. No.: WO2015/185561
PCT Pub. Date: Dec. 10, 2015

(65) Prior Publication Data
US 2017/0256959 A1 Sep. 7, 2017

(30) Foreign Application Priority Data
Jun. 3, 2014 (FR) .................................. 14 55042

(51) Int. Cl.
*H02J 7/00* (2006.01)
*G01R 19/00* (2006.01)
(Continued)

(52) U.S. Cl.
CPC .......... *H02J 7/007* (2013.01); *G01R 19/0084* (2013.01); *G01R 19/2513* (2013.01);
(Continued)

(58) Field of Classification Search
CPC ....................................................... H02J 7/007
(Continued)

(56) References Cited

U.S. PATENT DOCUMENTS 9,989,580 B2 * 6/2018 Feng .................... G01R 31/086

OTHER PUBLICATIONS

International Search Report dated Jun. 23, 2015 for corresponding International Application No. PCT/EP2015/062277, filed Jun. 2, 2015.
(Continued)

*Primary Examiner* — Edward Tso
*Assistant Examiner* — Ahmed Omar
(74) *Attorney, Agent, or Firm* — David D. Brush; Westman, Champlin & Koehler, P.A.

(57) ABSTRACT

A method for determining voltages and/or power available in an electrical recharging network that includes at least one voltage generator and at least one recharging terminal i corresponding, at a first instant $t_1$, to a predetermined reference impedance $z_{ii}$. At an instant $t_2$, the method implements at least one iteration of the following acts: estimating a changing of the reference impedance $z_{ii}$ into a modified impedance $z'_{ii}$; updating a voltage of the recharging terminal i by determining a modified inverted loop impedance matrix $Z_{loop\_M}^{-1}$ as a function of a reference inverted loop impedance matrix $Z_{loop\_R}^{-1}$ and of a difference between the modified impedance $z'_{ii}$ and the reference impedance $z_{ii}$, delivering a voltage $U'_i$; and verifying/updating a value of power available at the recharging terminal i as a function of a voltage $U'_i$, a maximum power of the generator and/or a threshold voltage delivering, an available power $P_{disp\_i}$.

11 Claims, 3 Drawing Sheets

Figure 1A:
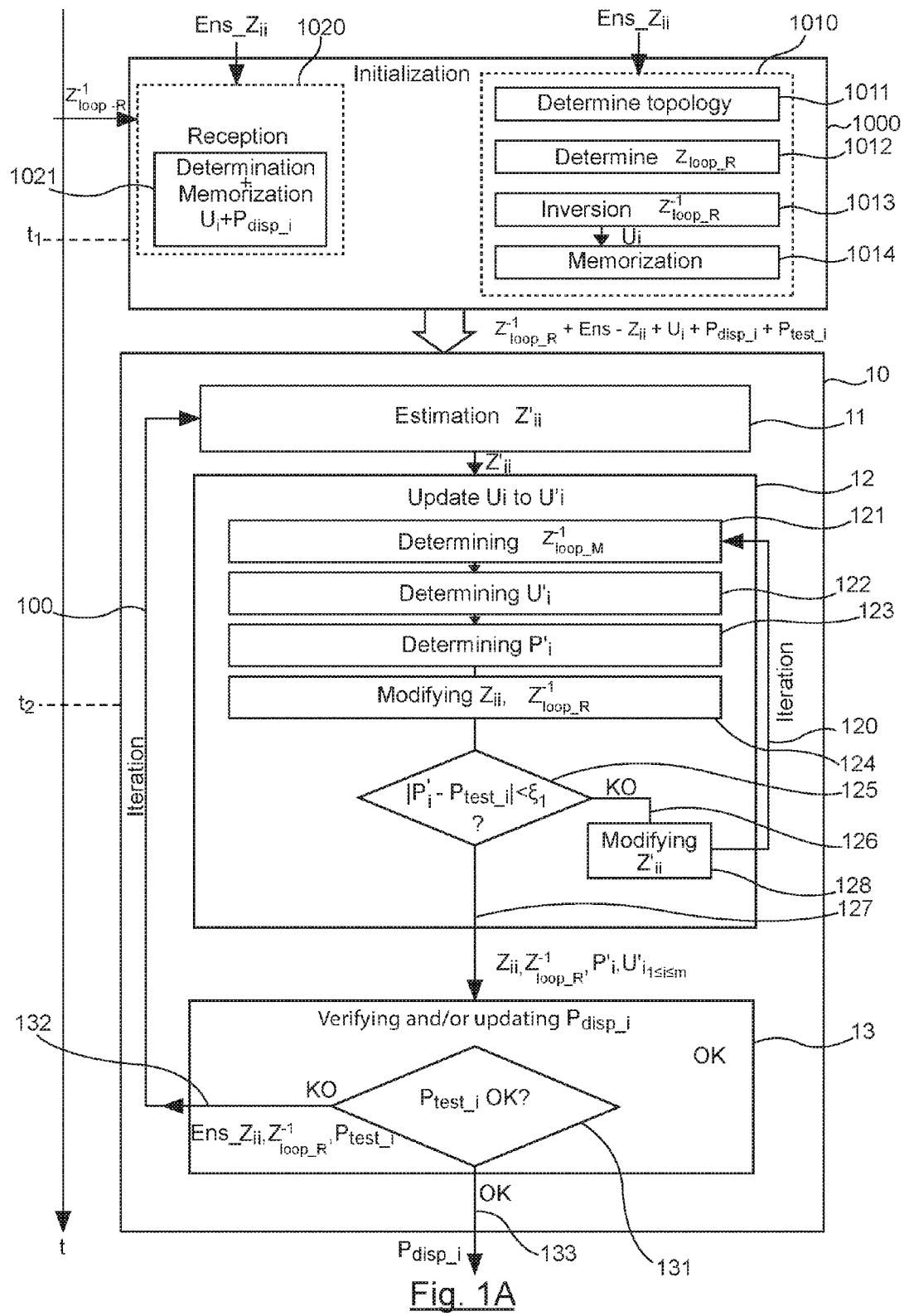

(51) Int. Cl.
*G01R 19/25* (2006.01)
*H02J 3/00* (2006.01)

(52) U.S. Cl.
CPC ....... H02J 7/0027 (2013.01); *H02J 2003/007* (2013.01); *H02J 2007/0096* (2013.01); *Y02E 40/76* (2013.01); *Y02E 60/76* (2013.01); *Y02T 10/7055* (2013.01); *Y04S 10/545* (2013.01); *Y04S 40/22* (2013.01)

(58) Field of Classification Search
USPC .......................................................... 320/162
See application file for complete search history.

(56) References Cited

OTHER PUBLICATIONS

English translation of the Written Opinion of the International Searching Authority dated Jun. 23, 2015 for corresponding International Application No. PCT/EP2015/062277, filed Jun. 2, 2015.

Ruiz Mario Alvarado et al., "TeleWatt: An Innovative Electric Vehicle Charging Infrastructure Over Public Lighting Systems", 2013 International Conference on Connected Vehicles and Expo (ICCVE), IEEE, Dec. 2, 2013 (Dec. 2, 2013), pp. 741-746, XP032587574.

Zdenek Kolka, et al., "Numerical Algorithms for Symbolic Analysis of Large Circuits", WSEAS 5th Proceedings, Dec. 16 2006 (Dec. 18, 2006), pp. 377-380, XP002735723.

Oepomo T.S. Ed—Rastegarnia A. et al., "A Step-by-Step Method for Z-loop Construction Using Graph Theory and Topology for Power System Studies", Computational Technologies in Electrical and Electronics Engineering, 2008. Sibircon 2008. IEEE Region 8 International Conference on, IEEE, Piscataway, NJ, USA, Jul. 21, 2008 (Jul. 21, 2008), pp. 186-191, XP031308983.

Tedja Santanoe Oepmo, "Graph Theory and Topology for 3 Phase Power System Under Faulted Studies", IJRRAS, Feb. 28, 2012 (Feb. 28, 2012)-Feb. 28, 2012 (Feb. 28, 2012), pp. 219-246, XP002735724.

French Search Report and Written Opinion dated Feb. 10, 2015 for corresponding French Application No. 1455042, filed Jun. 3, 2014.

\* cited by examiner

METHOD AND DEVICE FOR DETERMINING VOLTAGES AND/OR POWERS AVAILABLE IN AN ELECTRICAL RECHARGING NETWORK

CROSS-REFERENCE TO RELATED APPLICATIONS

This Application is a Section 371 National Stage Application of International Application No. PCT/EP2015/062277, filed Jun. 2, 2015, which is incorporated by reference in its entirety and published as WO 2015/185561 A1 on Dec. 10, 2015, not in English.

1. FIELD OF THE INVENTION

The field of the invention is that of the management of an electrical network.

More specifically, the invention relates to electrical recharging networks, for example public recharging networks such as low-voltage recharging networks for electric vehicles (EV) or again home electrical networks where devices can be connected/disconnected in order to be recharged.

The present invention relates more particularly to the real-time supervision of an electrical recharging network.

2. PRIOR ART 2.1 Electrical Networks and their Modeling

At present, a preponderant proportion of the electrical energy consumed the world over is carried by all existing electrical networks. In a little over a century, the term "electrical network" has changed its meaning from the pooling of a few production units to that of generalized interconnections covering entire continents.

While the scale and the ramifications of these networks have greatly increased their performance and potential, they have also led to complex systems managed by numerous operators and subject to major technical/economic constraints.

At the purely technological level, these constraints are mainly related to the fact electricity practically cannot be stored and, therefore, that the totality of the energy transfers made are managed in real time in such a way as to maintain, at the same time, standardized values of voltages and frequency as well as power margins to ensure the reliability of the systems.

For the management and supervision of these systems, various mathematical methods and modeling tools are conventionally used in order to analyze their operation (network matrices, computation of short-circuit currents, power distribution, transient modes, stability, etc.).

Conventionally, an electrical network is modeled in the form of a plurality of interconnected devices, each electrical conductor showing impedance.

It is well known that Robert Kirchhoff has proposed two laws, namely the current law and the voltage law to compute differences in potential at the terminals of each resistor and the intensity of the direct current in each branch of a complex circuit.

Such a representation in the form of nodes and branches has also been described in the document "*Graph Theory and Topology For* 3 *phase Power system under Faulted Studies*" (Tedja Santanoe Oepomo, IJRRAS 10(2) February 2012) which proposes to improve the analysis of computer-assisted electrical networks by building a loop impedance matrix $Z_{loop}$ that enables the simulation of electrical networks locally having short circuits or open circuits in the form of loops.

2.2 Electrical Recharging Networks and their Supervision

More recently, the development of electric vehicles is being accompanied by the deployment of recharging infrastructures. In France, recent studies have estimated that two million electric vehicles (EV) will be in circulation by 2020.

At the same time, the development of mobile terminals is being accompanied by the development of home electrical networks to which such mobile terminals can be connected/disconnected in order to get recharged.

The management of such recharging networks is becoming crucial and, to meet the consumer's needs, requires real-time supervision to determine the power available at each of the terminals while taking into account the connection/disconnection of the devices and more generally any electrical change in the network.

In particular, the availability or unavailability of a terminal is indicated to the user through a simple signaling system, for example a green light indicator or diode, or a red light indicator or diode to show the availability or unavailability of a terminal.

Taking account of this set of problems, the inventors have detected the fact that the present-day techniques used to manage and view an electrical network are not suited to the real-time supervision of an electrical recharging network.

Indeed, present-day methods are generally based on a modeling of the battery to be recharged by an impedance, the value of which is computed as a function of the power drawn at the terminal and the theoretical voltage given by the generator without taking account of voltage drops that can take place in the network.

To this end, such modeling methods consist in implementing several iterations of successive steps for building a loop impedance matrix of the electrical recharging network according to the resistive impedance of the battery, the inversion of this loop impedance matrix and the computing of voltage drops for any dipole of the network as well as of the levels of currents flowing through each of these dipoles.

These methods of modeling therefore have high complexity especially because of the step of inversion of the loop impedance matrix.

Indeed, for a matrix sized N, a prior-art inversion method such as the Gauss-Newton, Strassen, Schonage, and Coppersmith-Winograd inversion methods respectively have a complexity of $N^3$ (for Gauss-Newton), $N^{2.807}$, $N^{2.55}$, $N^{2.38}$ (of which some values are attained only asymptotically when N tends towards infinity).

And, for a recharging network, this complexity is multiplied by the number of iterations to be implemented in order to have a high estimate of the behavior of the electrical recharging network considered.

It therefore appears to be clear that the present methods are not compatible with the real-time viewing needs of the consumer who seeks at an instant t to know the recharging capacities, in other words the power available at each available terminal, of the recharging infrastructure.

There is therefore a need for a novel technique for managing an electrical network that can be used to deliver a reliable real-time view of the behavior and recharging capacities available in this electrical recharging network.

3. SUMMARY OF THE INVENTION

The invention proposes a novel solution that does not have all these drawbacks of the prior art in the form of a method for determining voltages and/or power available in an electrical recharging network, the electrical network comprising at least one voltage generator and at least two dipoles, including at least one recharging terminal i corresponding, at a first instant $t_1$, to a predetermined reference impedance $z_{ii}$.

According to the invention, at at least one second instant $t_2$, the method for determining implements at least one iteration of the following successive steps for at least said recharging terminal:
- estimating a changing of said reference impedance $z_{ii}$ into a modified impedance $z'_{ii}$,
- updating a voltage of said recharging terminal i, said updating implementing a step for determining a modified inverted loop impedance matrix $Z_{loop\_M}^{-1}$ as a function of a reference inverted loop impedance matrix $Z_{loop\_R}^{-1}$ and at least as a function of an impedance difference between said modified impedance $z'_{ii}$ and said reference impedance $z_{ii}$, delivering for said recharging terminal i a modified voltage $U'_i$,
- verifying and/or updating a value of power, called available power $P_{disp\_i}$, capable of being delivered by said recharging terminal i as a function of said modified voltage $U'_i$, a maximum value of power given by said voltage generator and/or a threshold voltage of said electrical network, delivering, in the event of updating, an updated value of available power.

In other words, according to the invention, in the event of an electrical change in the electrical recharging network, the step for updating the value of the voltage of the recharging terminal i is implemented simply by determining a modified inverted loop impedance matrix $Z_{loop\_M}^{-1}$ as a function of a reference inverted loop impedance matrix $Z_{loop\_R}^{-1}$ and at least one difference in impedance between the modified impedance $z'_{ii}$ and the reference impedance $z_{ii}$.

Thus, the invention proposes a novel technique for optimizing the description of the dynamic behavior of an electrical network in considering that any event in which one or more parameters of this electrical network are modified (typically the connecting or disconnecting of a device to or from a terminal which then modifies its impedance, the fluctuation of the value of an impedance related for example to the aging of the dipole to which it corresponds or again the variation of the value of impedance as a function of the recharging profile of a battery, such a profile possibly comprising a plurality of stages, etc.) relative to a reference configuration at an instant $t_1$, is equivalent to determining the state of the electrical network in terms of voltage and power at an instant $t_2$, such that $t_2=t_1+\varepsilon$.

For example, for a predetermined battery-charging profile comprising for example three stages, the impedance of the occupied or "busy" recharging terminal will vary at each instant of transition between these stages (a stage starting for example at the instant $t_1$ and terminating at the instant $t_2$); the technique according to the invention will therefore be implemented at each of these transitions to re-assess the power available that can be delivered by the other free terminals or terminals not in use.

Thus, depending on a predetermined charging profile, it is possible to synchronize the implementation of the technique according to the invention with the transitions between each charging stage. Hence, during the charging of a same device, the method according to the invention is implemented as many times as there are transitions in the charging profile of the battery of the device considered, in order to determine in real time the available power that can be delivered by each of the other free recharging terminals.

In the same way, the technique according to the invention can be implemented as a function of the energy distribution profile of the voltage generator.

Indeed, according to the invention, the step for determining an inverted impedance matrix $Z_{loop\_M}^{-1}$ representing the electrical network at the second instant $t_2$ is accelerated relative to the prior-art Gauss-Newton, Strassen, Schonage, or again Coppersmith-Winograd inversion because it requires only knowledge of the reference inverted loop impedance matrix $Z_{loop\_R}^{-1}$ of the reference configuration at an instant $t_1$, and the determining of the difference in impedance, for at least one recharging terminal i, between the reference configuration at the instant $t_1$, in which each recharging terminal i of the electrical network has a predetermined impedance and the configuration at the second instant $t_2$ corresponding to the change in state (and therefore the impedance value) of at least one recharging terminal of the electrical recharging network considered.

It must be noted that, according to the invention, when several impedance values are modified relative to the reference configuration, the updating of a voltage at the recharging terminal i, implements a step for determining a modified inverted loop impedance matrix $Z_{loop\_M}^{-1}$ as a function of a reference inverted loop impedance matrix $Z_{loop\_R}^{-1}$ and of each difference in impedance that is detected and/or estimated.

Thus, if two impedance values respectively of the terminal i and of the terminal j have varied between the reference instant $t_1$ and the instant $t_2$, the determining of a modified inverted loop impedance matrix $Z_{loop\_M}^{-1}$ will take account of the reference inverted loop impedance matrix $Z_{loop\_R}^{-1}$ as well as of the two differences $(z_{ii}'-z_{ii})$ et $(z_{jj}'-z_{jj})$. In a transposable way, the change in state of n impedance values leads to the taking into account of n differences in addition to the reference inverted loop impedance matrix $Z_{loop\_R}^{-1}$.

In other words, at the second instant $t_2$, the classic matrix inversion of the loop impedance matrix of the electrical network (where the reference impedance $z_{ii}$ has been replaced by the modified impedance $z'_{ii}$) is not implemented to determine the modified inverted loop impedance matrix $Z_{loop\_M}^{-1}$ representing the electrical network at this instant $t_2$.

On the contrary, the modified inverted loop impedance matrix $Z_{loop\_M}^{-1}$ used to determine the voltages and power available at the terminals of each dipole of the electrical recharging network is obtained through a simple relationship between the reference inverted loop impedance matrix $Z_{loop\_R}^{-1}$ of the reference configuration at an instant $t_1$ and at least the difference in impedance $(z'_{ii}-z_{ii})$.

It must be noted that the method for determining voltages and/or power available in an electrical recharging network according to the invention is an iterative method. Indeed, all three steps of estimation, updating a voltage of the recharging terminal i and verification and/or updating of the value of the available power are reiterated when the value of the available power to be tested is updated.

Thus, for each iteration needed to converge towards reliable values of voltage and power available at the terminals of the dipoles of the electrical recharging network, in order to meet the constraints of the electrical recharging network, namely the maximum power provided by the voltage generator and/or a threshold voltage of said electrical network, the complexity induced is substantially reduced when it is no longer necessary to reiterate a Gauss-Newton, Strassen, Schonage, or Coppersmith-Winograd inversion.

Such a gain in complexity at each iteration enables a real-time determining of the characteristics of voltage and power available for recharging a battery at a recharging terminal of the electrical recharging network considered.

It must be noted that a dipole according to the invention corresponds to an electrical component possessing two poles (or terminals), for example an electrical line, a loss line, a recharging terminal, an electrical device different from a recharging terminal, for example a public lighting device, a beverage dispenser in the case of a recharging network for electric vehicles (EV), stationary batteries, home electric appliances or again multimedia devices in the case of home electrical networks to which devices can be connected/disconnected in order to be recharged.

Thus, determining the voltages and/or power available in the electrical recharging network is implemented not only for the recharging terminals that constitute it but also for the other devices that it includes. It is therefore possible to inform the consumer of the available power that can be delivered by a recharging terminal while at the same time making sure that the other electrical devices of the electrical recharging network, for example a lighting device, will work accurately.

In other words, the method according to the invention permanently re-uses the at least two pieces of reference input data, namely the reference inverted loop impedance matrix $Z_{loop\_R}^{-1}$ and at least the reference impedance $z_{ii}$, to deliver at all points of the infrastructure of the electrical recharging network the characteristics of voltage and/or power available and to do so at each change in the electrical state of the network (expressed by the changing of at least one reference impedance $z_{ii}$ into a modified impedance $z'_{ii}$ of at least one recharging terminal of the electrical recharging network).

According to one particular aspect of the invention, the method for determining voltages and/or power available in an electrical recharging network comprises, at said first instant $t_1$ the following steps of initialization:
- determining a topology of said electrical recharging network in the form of an impedance network, each recharging terminal i being represented by said predetermined impedance $z_{ii}$,
- determining a reference loop impedance matrix $Z_{loop\_R}$ representing said electrical recharging network,
- for at least said electrical recharging terminal i, determining a value of available power to be tested $P_{test\_i}$, and
- determining an initialization voltage $U_i$ by inversion of said reference loop impedance matrix $Z_{loop\_R}$ delivering said reference inverted loop impedance matrix $Z_{loop\_R}^{-1}$,
- memorizing said reference inverted loop impedance matrix $Z_{loop\_R}^{-1}$.

In other words, the method according to the invention is also capable of implementing, in succession, an additional step of initialization in which the method itself determines the reference inverted loop impedance matrix $Z_{loop\_R}^{-1}$, followed by the general steps that constitute it as described above. To this end the method according to the invention uses one of the classic techniques of inversion, such as for example the Gauss-Newton, Strassen, Schonage or Coppersmith-Winograd inversion, only for determining the reference inverted loop impedance matrix $Z_{loop\_R}^{-1}$.

This ability to optionally implement a step of initialization confers autonomy on the method according to the invention. As a result, the method requires only knowledge of the predetermined impedance values of the dipoles constituting the network.

It must be noted that, according to another alternative, the method according to the invention can also implement a step for receiving the preliminarily determined or memorized reference inverted loop impedance matrix $Z_{loop\_R}^{-1}$ and to do so independently by means of existing prior art devices.

Thus, the method according to the invention in this alternative is capable of being combined with existing modules/techniques, these techniques enabling a specific one-time determination of a reference state of the electrical recharging network but not enabling a dynamic determining of the state of the network in real time at each change in state of the network. This is because of the excessively great complexity of these techniques which makes them incompatible with a real-time application.

According to another characteristic of the invention, said power available to be tested $P_{test\_i}$ capable of being delivered by said recharging terminal i corresponds at the first iteration to the maximum power $P_{bMax}$ capable of being provided by said recharging terminal i.

Thus, the method according to the invention takes account of the real characteristics of each recharging terminal. It must be noted that, if the electrical network comprises several recharging terminals, it is possible to take account of the values of maximum power $P_{bMax}$ which are distinct from one recharging terminal to another when these recharging terminals are different. For example, it is possible for an electrical recharging terminal to comprise several types of recharging terminals dedicated respectively to the recharging of electric cars, electric scooters/motorbikes or, again, electric bicycles, each type of recharging terminal being therefore capable of providing maximum power proper to the type of vehicle that it is to recharge.

According to one particular aspect of the invention, the reference loop impedance matrix $Z_{loop_R}$ corresponds to a matrix product such that:

$$Z_{loop\_R} = C^t * Z_{bb} * C$$

with:
C an incidence matrix of said electrical network obtained from said topology, $Z_{bb}$ a diagonal matrix containing a plurality of impedances, each impedance $z_{ii}$ corresponding to a recharging terminal of said plurality of dipoles.

The building of such a matrix is described in detail in the document "*Graph Theory and Topology For 3 phase Power system under Faulted Studies*" (Tedja Santanoe Oepomo, IJRRAS 10(2) February 2012).

It must be noted that for an electrical network whose topology remains fixed, the incidence matrix does not vary. For example, the fact of connecting/disconnecting a battery to/from a recharging terminal causes the impedance $z_{ii}$ to vary in the matrix $Z_{bb}$ of the branch comprising the recharging terminal without affecting the incidence matrix C which remains unchanged because the topology of the network remains the same.

Advantageously, the step for determining a modified inverted loop impedance matrix $Z_{loop\_M}^{-1}$ uses a Sherman-Morrison type relationship such that:

$$Z_{loop\_M}^{-1} = Z_{loop\_R}^{-1} - \frac{(z'_{ii} - z_{ii})Z_{loop\_R}^{-1} l_i^t l_i Z_{loop\_R}^{-1}}{1 + (z'_{ii} - z_{ii}) l_i Z_{loop\_R}^{-1} l_i^t}$$

with $l_i$ being a row vector formed by the $i^{th}$ row of said incidence matrix C.

Indeed, starting with the expression $Z_{loop_R} = C^t * Z_{bb} * C$ and taking $l_i$ to be the row vector formed by the $i^{th}$ row of the incidence matrix C, $Z_{loop}$ can be written in the following form:

$$Z_{loop\_R} = [l_1^t, \ldots, l_n^t] * \begin{bmatrix} z_{11} & \cdots & 0 \\ \vdots & \ddots & \vdots \\ 0 & \cdots & z_{nn} \end{bmatrix} * [l_1^t, \ldots, l_n^t]^t;$$

Thus, $$Z_{loop\_R} = [l_1^t, \ldots, l_n^t] * [z_{11} l_1^t, \ldots, z_{nn} l_n^t]^t;$$

giving, $$Z_{loop\_R} = z_{11} l_1^t l_1 + \ldots + z_{nn} l_n^t l_n. \quad (1)$$

When any change in the network causes a variation of the impedance $z_{ii}$ into $z_{ii}'$ ($1 \leq i \leq n$) and therefore the impedance matrix of the reference loop $Z_{loop\_R}$ into $Z_{loop\_M}$, the following relationship is set up:

$$Z_{loop\_M} - Z_{loop\_R} = (z_{ii}' - z_{ii}) l_i^t l_i. \quad (2)$$

Whence, $$Z_{loop\_M} = Z_{loop\_R} + (z_{ii}' - z_{ii}) l_i^t l_i. \quad (3)$$

Besides, there is the known Sherman-Morrison formula such that if a reversible matrix A sized N is considered, u and v being two column vectors sized N, then if $(1+v^t A^{-1} u) \neq 0$:

$$(A + uv^t)^{-1} = A^{-1} - \frac{A^{-1} u v^t A^{-1}}{1 + v^t A^{-1} u}$$

the complexity of which, when $A^{-1}$ is already computed, is $N^2$.

Applying the Sherman-Morrison formula of matrix inversion to (3), the inverse of $Z_{loop\_M}$ as a function of $Z_{loop\_R}$ can be written as follows:

$$Z_{loop\_M}^{-1} = Z_{loop\_R}^{-1} - \frac{(z_{ii}' - z_{ii}) Z_{loop\_R}^{-1} l_i^t l_i Z_{loop\_R}^{-1}}{1 + (z_{ii}' - z_{ii}) l_i Z_{loop\_R}^{-1} l_i^t} \quad (4)$$

Thus, once the inverse of the impedance matrix of the reference loop $Z_{loop\_M}$ has been computed for a first time (by means of any unspecified method of inversion such as for example the Gauss-Newton inversion method, the complexity of which is the order of $N^3$, where N represents the size of the matrix $Z_{loop\_R}$), the inverse of $Z_{loop\_M}$ (which is only any unspecified modification of the reference loop impedance matrix $Z_{loop\_M}$ at the level of one of these impedance values $z_{ii}$) will be computed by means of the Sherman-Morrison formula, the complexity of which is of the $N^2$ order.

Besides, on the basis of this general principle, it must be noted that when any unspecified change in the network causes a variation in the impedance values $z_{ii}$ and $z_{jj}$ respectively into $z_{ii}'$ and $z_{jj}'$, the modified matrix $Z_{loop\_M}$ can be written as follows:

$$Z_{loop\_M} = Z_{loop\_R} + (z_{ii}' - z_{ii}) l_i^t l_i + (z_{jj}' - z_{jj}) l_j^t l_j \quad (5)$$

In writing $$Z_{loop\_I} = Z_{loop\_R} + (z_{ii}' - z_{ii}) l_i^t l_i \quad (6)$$

we obtain:

$$Z_{loop\_M} = Z_{loop\_I} + (z_{jj}' - z_{jj}) l_j^t l_j \quad (7)$$

Thus, to compute the inverse of $Z_{loop\_M}$, we apply first of all the Sherman-Morrison formula successively to (6) and (7) (in considering the inverse of $Z_{loop\_R}^{-1}$ to have been already computed by means of any unspecified inversion method, the complexity of the computation will be of the order of $N^2$). This concept of computing a matrix inversion from $Z_{loop\_R}^{-1}$ is easily generalized to the case where $Z_{loop\_R}$ undergoes a modification of a number p of its impedances.

According to one particular aspect of the invention, said step of estimation delivers said modified impedance value $z_{ii}'$ such that $$z_{ii}' = \frac{U_i^2}{P_{test\_i}}.$$

Indeed, it must be noted that the term "estimation of a changing of said reference impedance $z_{ii}$ into a modified impedance $z_{ii}'$" is understood to refer to the fact that the method according to the invention detects (detection of the connection of a battery) a real or imminent change in impedance or receives a piece of information representing a real or imminent change in impedance (request for simulating a reservation of a recharging terminal by a user through his mobile terminal). For all that, the method according to the invention knows that the reference impedance value $z_{ii}$ will be modified or is modified but does not know the true value of the modified impedance $z_{ii}'$ during the first iteration of the steps of the method according to the invention.

According to another aspect of the invention, for each iteration, the step for updating a voltage of said recharging terminal i implements at least one iteration of the following successive steps:
  determining said modified inverted matrix $Z_{loop\_M}^{-1}$ as a function of said reference inverted matrix $Z_{loop\_R}^{-1}$ and said difference in impedance between said modified impedance $z_{ii}'$ and said reference impedance $z_{ii}$,
  determining said modified voltage $U_i'$ from said modified inverted matrix $Z_{loop\_M}^{-1}$,
  determining an estimation of power $P_i'$ delivered by the recharging terminal i such that $$P_i' = \frac{U_i'^2}{z_{ii}'},$$

modifying the reference impedance $z_{ii}$ so that it is equal to said modified impedance $z_{ii}'$ delivered by said step of estimation and modifying the value of the reference inverted loop impedance matrix $Z_{loop\_R}^{-1}$ so that it is equal to the value of the modified inverted loop impedance matrix $Z_{loop\_M}^{-1}$, and
  comparing a first pre-determined threshold with the absolute value of the difference between said estimation of the power $P_i'$ and said available power to be tested $P_{test\_i}$ of said recharging terminal i and ending of said iterations of said successive steps of said step for updating a voltage of said recharging terminal i when said absolute value is lower than said threshold value; if not, for the following iteration of said successive steps of said step for updating of voltage of said recharging terminal i, modifying said modified impedance $z_{ii}'$ such that $$z'_{ii} = \frac{Ur_i^2}{P_{test\_i}}.$$

Thus, according to the method of the invention, the step for updating a voltage of said recharging terminal i is itself iterative in order to converge towards the true value of the modified impedance $z'_{ii}$. It must be noted that, once the true value of the modified impedance $z'_{ii}$ has been obtained, the last values of the reference impedance $z_{ii}$ and of the reference inverted loop impedance matrix $Z_{loop\_R}^{-1}$ are kept so long as the verification of the available power value $P_{disp\_i}$ capable of being delivered by the recharging terminal i has not been done, in order to serve as a starting point when the available power to be tested $P_{test\_i}$ is updated making it necessary to reiterate the three steps of estimation, updating a voltage of said recharging terminal i and checking and/or updating the value of the available power. Furthermore, advantageously, these updated values of reference impedance $z_{ii}$ and of the reference inverted loop impedance matrix $Z_{loop\_M}^{-1}$ are thereafter used for a subsequent change in configuration at an instant $t_3 > t_2$.

Thus, it can be understood that the method according to the invention implements, according to this embodiment, two imbricated iterative loops.

For k iterations of the steps of the updating step, as compared with an overall complexity equal to $kN^3$ of a classic method implementing a Newton inversion for the matrix inversion, the complexity of the method according to the invention is reduced to $N^3 + (k-1)N^2$ where N represents the size of the matrix $Z_{loop\_R}$ representing the network.

For example, for an electrical network comprising both recharging terminals and public lighting, such that the size of the matrix $Z_{loop\_R}$ is such that $N \approx 90$, the complexity for determining the power values available on each dipole, when k=5 iterations are needed, is of the order of $5 \times 90^{+3} = 3.645.000$ with the Gauss-Newton classic matrix inversion whereas, with the method according to the invention, this complexity is only $90^{+3} + 4.90^{+2} = 761.400$, or nearly five times less.

According to one particular aspect, when a total power value corresponding to the sum of the estimations of power delivered by said at least two dipoles is greater than said maximum power provided by said voltage generator or when a modified voltage $U'_i$ of at least one of said at least two dipoles is smaller than said threshold voltage of said electrical network, said step for verifying and/or updating the value of power available from said recharging terminal i implements a step for updating the value of said available power to be tested $P_{test\_i}$ for the following iteration, and the step for updating the value of said available power to be tested $P_{test\_i}$ implements a dichotomy such that $$P_{test\_i} = \frac{P_{max} + P_{min}}{2}$$

with $P_{max}$ corresponding, at initialization, to the maximum power $P_{bMax}$ capable of being provided by said recharging terminal i, and then to said estimation of the power $P'_i$ when a total power corresponding to the sum of the estimations of power delivered by said at least two dipoles is greater than said maximum power provided by said voltage generator or when a modified voltage $U'_i$ of at least one of said at least two dipoles is smaller than said threshold voltage of said electrical network, and $P_{min}$ corresponding at initialization to zero power and then to said estimation of the power $P'_i$ when said total power is smaller than said maximum power given by said voltage generator and when each voltage of each of said at least two dipoles is greater than said threshold voltage of said electrical network and when $P_{max}$ is lower than the maximum power $P_{bMax}$ capable of being provided by said recharging terminal i, and the difference between the power $P_{max}$ and the power $P_{min}$ is greater than a second predetermined threshold.

Implementing a dichotomy, the parameters of which evolve, while at the same time verifying the constraints of the network, enables simple convergence towards the power available in real time for each recharging terminal.

According to one particular aspect, the method according to the invention furthermore comprises a step of signaling, representing said available power capable of being delivered by said recharging terminal i.

Thus, for example by using a flashing light signal or again a pre-determined color of a light delivered by the lighting unit, it is possible to signal the state of availability/unavailability of each terminal (for example using green/red respectively) but also, by means of flashing or of a pre-determined color, for example blue, to indicate the least energy-consuming terminal.

In another embodiment, the invention relates to a device for determining voltages and/or power available in an electrical recharging network, said electrical network comprising at least one voltage generator and at least two dipoles, including at least one recharging terminal i corresponding, at a first instant $t_1$, to a pre-determined reference impedance $z_{ii}$.

According to the invention, such a device comprises:
a module for estimating a changing of said reference impedance $z_{ii}$ into a modified impedance $z'_{ii}$,
a module for updating a voltage of said recharging terminal i, said updating implementing a step for determining a modified inverted loop impedance matrix $Z_{loop\_M}^{-1}$ as a function of a reference inverted loop impedance matrix $Z_{loop\_R}^{-1}$ and at least as a function of a difference in impedance between said modified impedance $z'_{ii}$ and said reference impedance $z_{ii}$, delivering a modified voltage $U'_i$ for said recharging terminal i,
a module for verifying and/or updating a value of power, called available power $P_{disp\_i}$, capable of being delivered by said recharging terminal i as a function of said modified voltage $U'_i$, of a maximum power provided by said voltage generator and/or of a threshold voltage of said electrical network delivering, in case of updating, an updated available power,
said modules for estimating, updating a voltage and verifying and/or updating a value of power being activated successfully at at least one second instant $t_2$ for at least said recharging terminal i.

Such a device for determining voltages and/or power available in an electrical recharging network is especially suited to implementing the method for determining voltages and/or power available in an electrical recharging network described above. This device for determining voltages and/or power available in an electrical recharging network could of course comprise the different characteristics of the method for determining voltages and/or power available in an electrical recharging network described above, which can be combined or taken in isolation. Thus the characteristics and advantages of this device for determining voltages and/or power available in an electrical recharging network are the same as those of the method for determining voltages and/or power available in an electrical recharging network. They are therefore not described in more ample detail.

The invention also concerns a computer program comprising instructions for implementing a method for determining voltages and/or power available in an electrical recharging network described above when this program is executed by a processor.

This program can use any programming language whatsoever and can be in the form of source code, object code or a code that is intermediate between source code and object code, such as in a partially compiled form or in any other desirable form.

The method according to the invention can therefore be implemented in various ways, especially in wired form and/or in software form.

The invention also relates to one or more computer-readable information carriers comprising instructions of one or more computer programs as mentioned here above.

4. LIST OF FIGURES

Figure 1B:
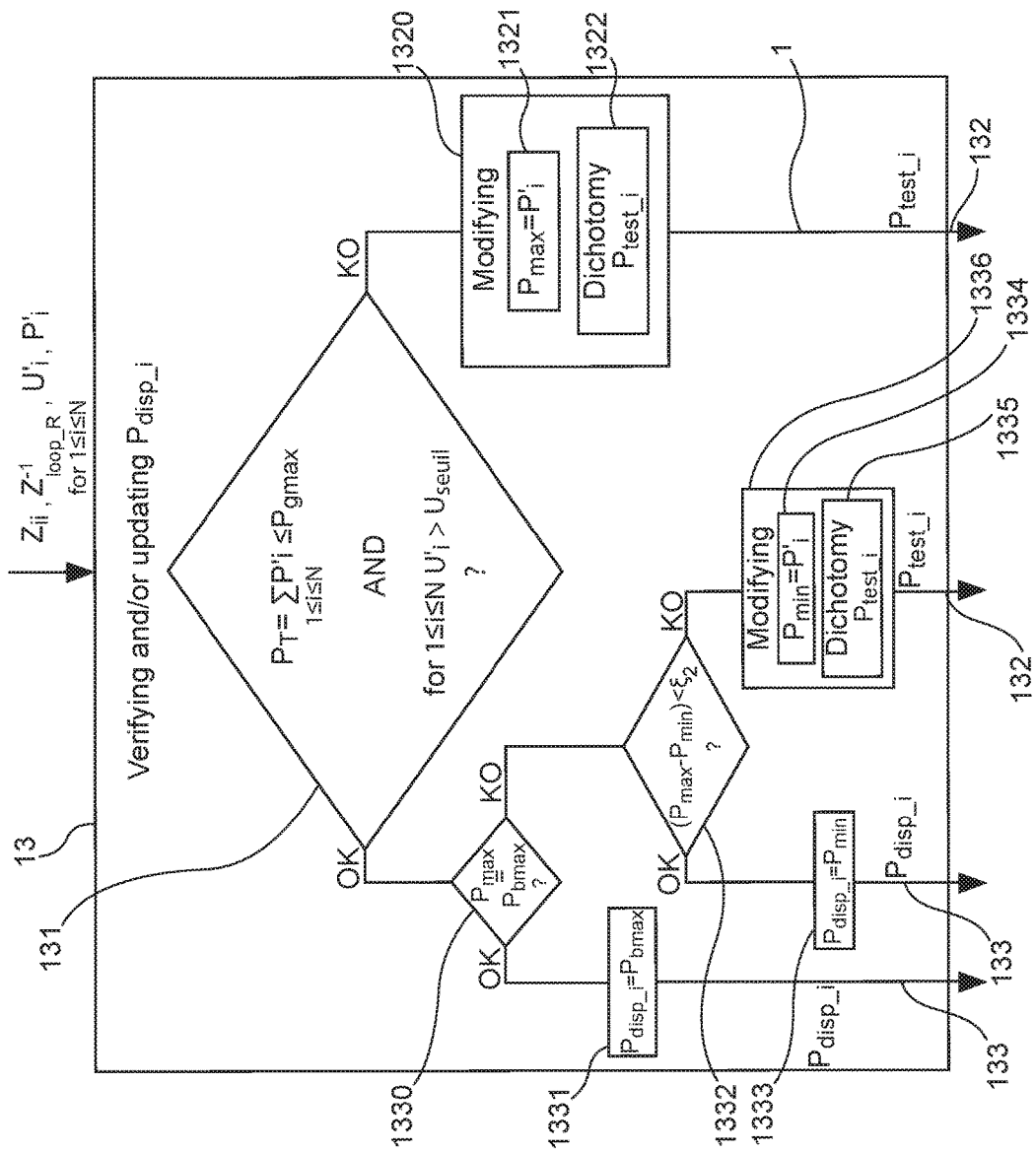

Other features and advantages of the invention shall appear more clearly from the following description of a particular embodiment, given by way of a simple, illustratory and non-exhaustive example and from the appended drawings of which:

FIGS. 1A and 1B respectively present the main steps of the method for determining voltages and/or power available in an electrical recharging network according to one embodiment of the invention, and an embodiment of the step for verifying and/or updating the value of the power available capable of being delivered by a recharging terminal i.

Figure 2:
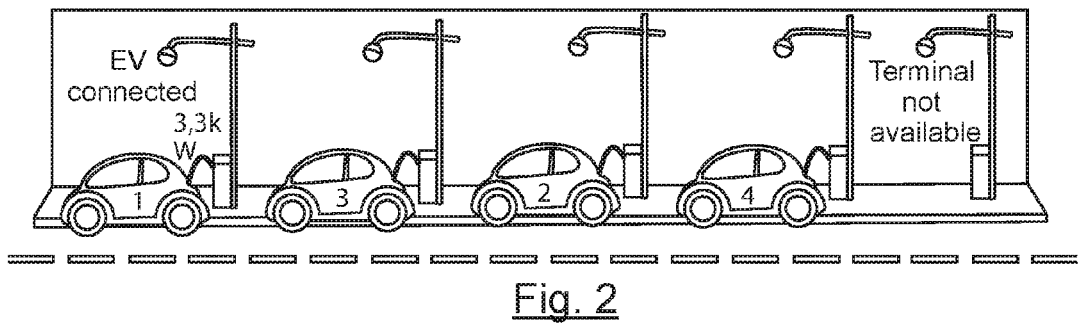
Figure 3:
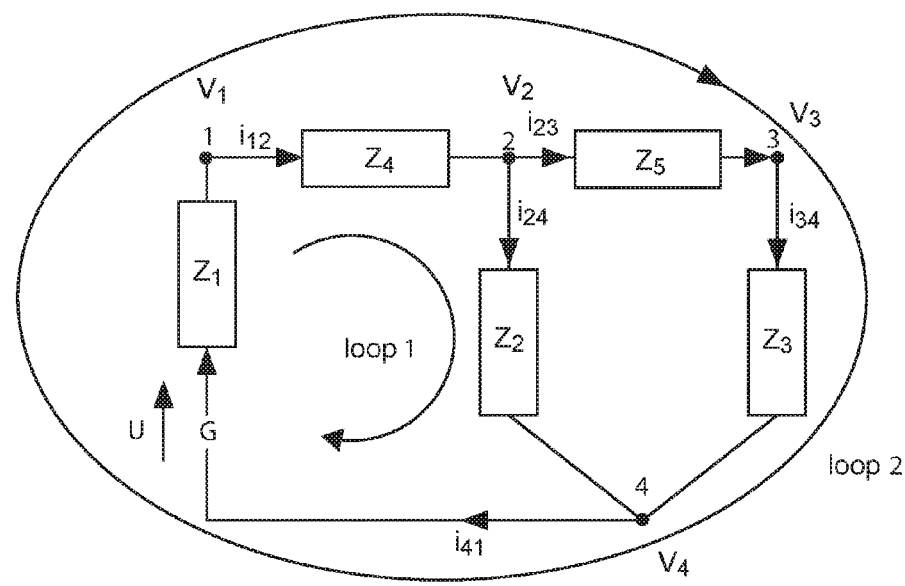
Figure 4:
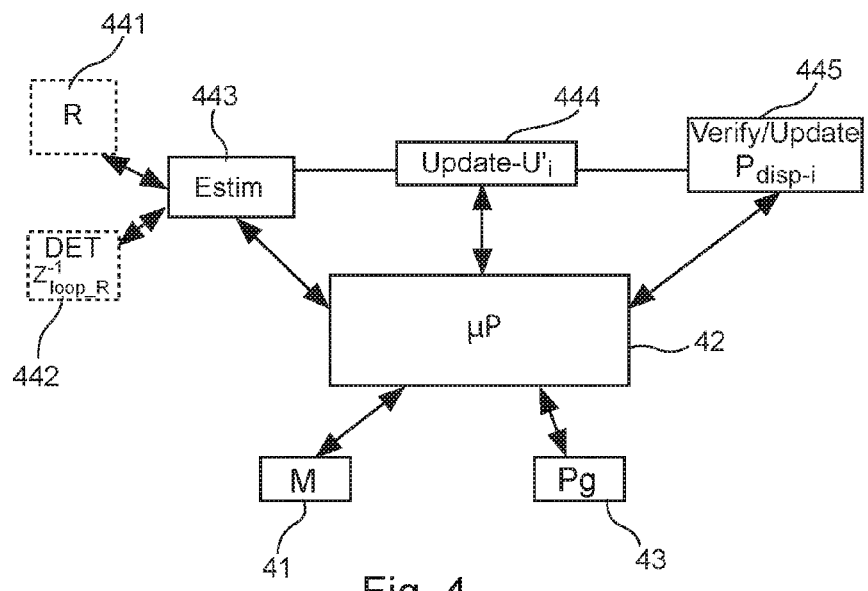

FIG. 2 illustrates an example of a structure of an electrical recharging network, FIG. 3 illustrates a representation in the form of impedances of an electrical recharging network, FIG. 4 is a schematic representation of a radiofrequency transmission device according to one example of the invention.

5. DESCRIPTION OF ONE EMBODIMENT OF THE INVENTION

5.1 General Principle

The invention proposes to efficiently and simply implement a real-time determining of the electrical state of any point of the infrastructure of a network by using, at an instant $t_2$, a modified inverted loop impedance matrix $Z_{loop\_M}^{-1}$ obtained simply as a function of a reference inverted loop impedance matrix $Z_{loop\_R}^{-1}$ determined classically at the reference instant $t_1$, and as a function of any differences in impedance detected between the reference configuration of the electrical network at the reference instant $t_1$ and the configuration at the instant $t_2$.

Such a determining operation is optimized as compared with the prior art since it avoids the classic matrix inversion of the loop impedance matrix of the electrical network and replaces this step by a simplified determining operation requiring only knowledge of the reference inverted loop impedance matrix $Z_{loop\_R}^{-1}$ of the reference configuration at an instant $t_1$, and the determining of the difference or differences in impedance between the current instant $t_2$ and the reference instant $t_1$.

Indeed, classically in the Gauss-Newton inversion method used for matrix inversion, the complexity induced by a loop impedance matrix sized N is the order of $N^3$, whereas, according to the invention, the complexity of the step used to obtain a modified inverted loop impedance matrix $Z_{loop\_M}^{-1}$ at an instant $t_2$ can be reduced to the order of $N^2$.

This simplification makes it possible to obtain a time that is small enough to be perceived as being instantaneous by an operator seeking real-time knowledge of the values of a voltage drop or again of power consumed by an electrical network supplying for example recharging terminals for electric vehicles.

Thus, for an electrical network configuration subject to constraints of known drops in voltage and power, the invention makes it possible to determine the availability of a recharging terminal almost instantaneously.

The method according to the invention can for example be combined with any existing method for allocating recharging terminals to all-electric or hybrid vehicles in order to determine the availability or unavailability of a recharging terminal and can ultimately make it possible, by means of a signaling system, to orient the electric vehicles to the least energy-consuming recharging terminals.

5.2 Description of One Particular Embodiment

Referring to FIG. 1A, we now present the main steps implemented by a method for determining voltages and/or power available in an electrical recharging network. These difference steps are for example implemented within a device for determining voltages and/or power available in an electrical recharging network which especially can be integrated into a control unit of an electrical recharging network.

In particular, the electrical network comprises at least voltage generator and at least two dipoles, at least one of which is a recharging terminal i corresponding, at a first instant $t_1$ to a pre-determined reference impedance $z_{ii}$ as illustrated for example by FIG. 3 described in greater detail here below.

The method for determining voltages and/or power available in an electrical recharging networking according to the invention comprises two phases, an optional phase of initialization 1000 and a step of dynamic determining 10 of the characteristics of the voltages and/or power at any point of the recharging structure and at any instant or at least at each change in configuration relative to the configuration of initialization at an instant $t_1$.

The optional phase of initialization 1000 is aimed at obtaining all the characteristics of the electrical recharging network in the configuration of initialization, also called a reference configuration at the instant $t_1$ as if the impedance of each electrical dipole were constant in time. In this case, the impedance values of the recharging terminals that are free (i.e. not connected) have high values and correspond to an open circuit.

Such an optional phase of initialization 1000 can be implemented by a module or a device independent of the device for determining voltages and/or power available in an electrical recharging network according to the invention. According to this alternative, the initialization phase then consists in receiving 1020 the impedance values Ens_$Z_{ii}$ of all the dipoles of the electrical network and a reference inverted loop impedance matrix $Z_{loop\_R}^{-1}$ determined or memorized beforehand, this being done independently by existing prior art devices.

Thus, the method of the invention according to this alternative is capable of being combined with existing modules/techniques for the specific one-time determining of a reference state of the electrical recharging network. However, these prior art techniques do not make it possible, at each change in configuration, to obtain a dynamic configuration of the state of the network in real time because of their excessively great complexity which makes them incompatible with real time application.

From the reference inverted loop impedance matrix $Z_{loop\_R}^{-1}$ and the impedances Ens_$Z_{ii}$ received and applying the method disclosed in the document "*Graph Theory and Topology For* 3 *phase Power system under Faulted Studies*" (Tedja Santanoe Oepomo, IJRRAS 10(2) February 2012), it is then possible, for each dipole of the electrical recharging network, to determine 1021 initialization voltages $U_i$ and the power available to be tested $P_{test\_i}$ of said at least one free i.e. not connected, recharging terminal i or the available power of the free recharging networks when the network comprises several free terminals.

According to another alternative 1010, the device for determining voltages and/or power available in an electrical recharging network according to the invention is capable of itself implementing the initialization phase 1000.

In this case, the device for determining voltages and/or power available in an electrical recharging network according to the invention first of all implements a step 1011 for determining a topology of said electrical recharging network in the form of an impedance network, each recharging terminal i being represented by said pre-determined impedance $z_{ii}$ as illustrated in FIG. 3 described in greater detail below.

Then, to determine the currents that pass through all the impedances as well as the difference in potential at the terminals of each of them, the initialization phase implemented 1010 by the device for determining voltages and/or power available in an electrical recharging network according to the invention comprises a step 1012 for determining a reference loop impedance matrix $Z_{loop\_R}$ representing the electrical recharging network.

Such a loop impedance matrix $Z_{loop\_R}$ is especially obtained and applied to the technique for building a loop matrix described in the document "*Graph Theory and Topology For* 3 *phase Power system under Faulted studies*" (Tedja Santanoe Oepomo, IJRRAS 10(2) February 2012) implementing the construction of five tables specific to the loop of the circuit of the electrical network considered.

According to this particular construction, the reference loop impedance matrix $Z_{loop\_R}$ corresponds to a matrix product such that:

$$Z_{loop\_R} = C^{t} * Z_{bb} * C$$

with:
C an incidence matrix of said electrical network obtained from said topology,
$Z_{bb}$ a diagonal matrix containing a plurality of impedance values, each impedance $z_{ii}$ corresponding to a recharging terminal i of said plurality of dipoles.

An example of an application of said method will be described especially here below with respect to FIG. 3.

Then, mesh currents are obtained in applying the relationship: $I = Z_{loop\_R}^{-1} U$. Thus for at least one recharging terminal i (considered to be free in the reference configuration of the instant $t_1$), the initialization voltage $U_i$ of said recharging terminal i is obtained by inversion 1013 of the reference loop impedance matrix $Z_{loop\_R}$ delivering the reference inverted loop incidence matrix $Z_{loop\_R}^{-1}$. This is for example a Gauss-Newton, Strassen, Schonage or Coppersmith-Winograd inversion.

According to one particular aspect of the embodiment of the invention represented in FIG. 1A, the available power to be tested $P_{test\_i}$ capable of being delivered by the recharging terminal i corresponds, at the first iteration of the dynamic determining phase 10, to the maximum power $P_{bMax}$ capable of being provided by said recharging terminal i.

Finally, in order to be re-utilized thereafter for a change in configuration with reference to the reference configuration of the instant $t_1$, the reference inverted loop impedance matrix $Z_{loop\_R}^{-1}$ is memorized 1014.

At an instant $t_2$, the phase of dynamic determination 10 of the characteristics of voltages and/or power of the electrical network receives an input reference inverted loop impedance matrix $Z_{loop\_R}^{-1}$ representing a configuration of the electrical network at a given instant, as well as all the impedance values Ens_$Z_{ii}$ of the previous configuration and the voltages $U_i$ of each dipole and of the available power to be tested $P_{test\_i}$ of each dipole corresponding to a recharging terminal of the previous configuration.

It must be noted that during the first implementation of the dynamic determining phase 10, these characteristics correspond to the initialization characteristics relating to the reference configuration at the instant $t_1$ obtained with a classic inversion.

However, at an instant $t_3 > t_2$, these characteristics can come from the dynamic determining phase 10 for determining the characteristics of the voltages and/or power of the electrical network according to the invention carried out for a change in configuration preceding an instant $t_2$ such that $t_1 < t_2 < t_3$.

During a first step 11, the changing of said reference impedance $z_{ii}$ into a modified impedance $z'_{ii}$ is estimated 11. In particular, the step of estimation delivers, for a terminal i, a modified impedance $z'_{ii}$ such that $$z'_{ii} = \frac{U_i^2}{P_{test\_i}},$$

with $U_i$ and $P_{test\_i}$ being the voltages and/or power available to be tested obtained for the recharging terminal i, at a previous configuration relative to an instant $t_d$ such that $t_1 < t_d < t_2$.

It must be noted that the method for determining voltages and/or power available in an electrical recharging network according to this embodiment of the invention is an iterative method. Indeed, when an effective or imminent changing of impedance (the user trying to recharge his battery has made a request prior to his approach to know the availability and the available power that can be delivered by each recharging terminal) is estimated 11, the method according to the invention "starts" from a modified impedance value of initialization to converge at each iteration towards the true modified impedance value.

Following this estimation 11, the method according to the invention implements a step 12 for updating a voltage of the recharging terminal i which is itself iterative 120 in order to converge towards the true modified impedance values $z'_{ii}$.

Then, once the true modified impedance value $z'_{ii}$ has been obtained 12, the verification 13 of available power $P_{disp\_i}$ that can be delivered by the recharging terminal i is done and if the available power to be tested $P_{test\_i}$ is modified, the three steps of estimation 11, updating 12 of a voltage of said recharging terminal i and verification and/or updating 13 of the value of the power available are reiterated 100; if not, an updated available power $P_{disp\_i}$ is delivered (this power corresponding (1331) to the maximum power $P_{bMax}$ that can be provided by the recharging terminal i (should it have been verified that the available power for initialization corresponding to the maximum power $P_{bMax}$ that can be provided by the recharging terminal is consistent with the constraints of the network) or corresponding (1333) to the available power updated at $P_{min}$).

More specifically, the updating step 12 at least implements a step 121 for determining a modified inverted loop impedance matrix $Z_{loop\_M}^{-1}$ as a function of a reference inverted loop impedance matrix $Z_{loop\_R}^{-1}$ and at least as a function of a difference in impedance between the modified impedance $z'_{ii}$ and the reference impedance $z_{ii}$.

In particular, the step 121 for determining a modified inverted loop impedance matrix $Z_{loop\_M}^{-1}$ uses a Sherman-Morrison type relationship such that:

$$Z_{loop\_M}^{-1} = Z_{loop\_R}^{-1} - \frac{(z'_{ii} - z_{ii})Z_{loop\_R}^{-1} l_i^t l_i Z_{loop\_R}^{-1}}{1 + (z'_{ii} - z_{ii})l_i Z_{loop\_R}^{-1} l_i^t}$$

with $l_i$ a row vector formed by the $i^{th}$ row of said incidence matrix C.

Once the modified inverted matrix $Z_{loop\_M}^{-1}$ has been obtained speedily with the Sherman-Morrison formula, the complexity of which is of the order of $N^2$ (against $N^3$ for the Gauss-Newton inversion method), it is possible to easily determine 122 the modified voltage $U'_i$ at the terminals of each dipole i of the electrical recharging network. A numerical example is described in detail below with reference to FIG. 3 to illustrate this determining of the modified voltage $U'_i$.

From the modified voltage $U'_i$ of the recharging terminal i, the updating step 12 implements the determining 123 of an estimation of a power $P'_i$ delivered by the recharging terminal i such that $$P'_i = \frac{U'^2_i}{z'_{ii}},$$

and then carries out the modification (124) of the reference impedance $z_{ii}$ so that this impedance is equal to said modified impedance $z'_{ii}$ delivered by said step of estimation and the modification of the value of the reference inverted loop impedance matrix $Z_{loop\_R}^{-1}$ so that this value is equal to the value of the modified inverted loop impedance matrix $Z_{loop\_M}^{-1}$.

The updating step 12 then implements the comparison 125 with a first pre-determined threshold of the absolute value of the difference between said estimation of the power $P'_i$ and said power available to be tested $P_{test\_i}$ of said recharging terminal i. It ends 127 (OK) said iterations of said successive steps (121, 122, 123, 124, 125) of said step 12 for updating a voltage of said recharging terminal i when said absolute value $|P'_i - P_{test\_i}|$ is below said threshold value $\xi_1$ (for example $\xi_1$ is equal to 10 W). Else it carries out 126 (KO) the following iteration of the successive steps (121, 122, 123, 124, 125) of said step of updating a voltage of said recharging terminal i, modifying 128 said modified impedance $z'_{ii}$ such that $$z'_{ii} = \frac{U'^2_i}{P_{test\_i}},$$

and memorizing these new reference parameters used for the following iteration of the steps (121, 122, 123, 124 and 125) constituting the updating step 12 according to the invention.

Thus, the "modified" parameters obtained at an iteration of the steps (121, 122, 123, 124 and 125) constituting the updating step 12 become the "reference" parameters memorized for the next iteration of these steps.

It must be noted that when the condition $|P'_i - P_{test\_i}| < \xi_1$ is met, the true value of the modified impedance $z'_{ii}$ seems to have been obtained: in other words the iterative steps (121, 122, 123, 124 and 125) of the updating step 12 have converged.

However, it is necessary to verify that the electrical constraints of the network are met. To this end, the dynamic determining step 10 implements a step of verification and/or updating 13 of a value of power, called available power $P_{disp\_i}$ capable of being delivered by the recharging terminal i as a function of said modified voltage $U'_i$, f a maximum power $P_{gMax}$ given by the voltage generator and/or a threshold voltage $U_{seuil}$ (for example $U_{seuil}$=210V) of the electrical network delivering, in the event of updating, a modified available power $P_{disp\_i}$.

Such a step of verification and/or updating 13 of the value of the available power $P_{disp\_i}$, therefore amounts to testing 131 whether the value of the available power to be tested $P_{test\_i}$ used for the first iteration of the three steps of estimation 11, updating 12 a voltage of said recharging terminal i and verifying and/or updating 13 is reliable with respect to the working constraints of the electrical recharging network.

Indeed, it is possible that the electrical recharging network will combine several functions such as a public lighting function and a recharging function: the recharging and the corresponding use of the available power of a terminal should therefore not prevent the efficient working of the public lighting network.

Thus, for example, at night the available power that can be delivered by a recharging terminal also used to provide public lighting is lower than the available power that can be delivered by this same recharging terminal during daytime.

One embodiment of the step of verification and/or updating of the value of the available power that can be delivered by a recharging terminal i is illustrated by FIG. 1B.

According to this embodiment, the step of verification and/or updating 13 of the value of an available power $P_{disp\_i}$ of said recharging terminal i implements an updating step 1320 for updating the value of said available power to be tested $P_{test\_i}$ when the test 131 "$P_{test\_i}$ ok?" which is equivalent to verifying "$P_T = \Sigma_{1 \leq i \leq n} P'_i \leq P_{gMax}$ AND for $1 \leq i \leq n$ $U'_i > U_{seuil}$" is negative. In other words, when the test 131 is not successful (KO), i.e. when a total power $P_T$ corresponding to the sum of the estimations of power $P'_i$ delivered by at least two dipoles is greater than the maximum power $P_{gMax}$ given by the voltage generator or when a modified voltage $U'_i$ of at least one of the at least two dipoles is lower than the threshold voltage $U_{seuil}$ of the electrical network, the power available to be tested $P_{test\_i}$ (used for the first iteration of the three steps of the dynamic determining phase 10) is modified 1320.

The available power to be tested $P_{test\_i}$ is also modified 1336 when the total power is lower than the maximum power given by the voltage generator and when each voltage of each of the two dipoles is greater than the threshold voltage of the electrical network (in other words when the test 131 is successful (OK)), and when $P_{max}$ is lower than the maximum power $P_{bMax}$ capable of being given by the recharging terminal i (in other words when the test 1330 is not successful(KO)), and when the difference between the power $P_{max}$ and the power $P_{min}$ is greater than a second pre-determined threshold $\xi_2$ (for example $\xi_2$ is equal to 5 W) (in other words when the test 1332 is not successful (KO)).

So long as the available power to be tested $P_{test\_i}$ is modified (132), the available power is not determined (133).

This step for modifying the value of the available power to be tested $P_{test\_i}$ implements for example a dichotomy (1322, 1335) such that $$P_{test\_i} = \frac{P_{max} + P_{min}}{2}$$

with $P_{max}$ corresponding, at initialization, to the maximum power $P_{bMax}$ that can be given by the recharging terminal i, then (1321) to the estimation of the power $P'_i$ when a total power $P_T$ corresponding to the sum of the estimations of power delivered by all the dipoles is greater than the maximum power given by the voltage generator $U'_i$ or when a modified voltage $U_{seuil}$ of at least one recharging voltage is smaller than a certain threshold voltage of the electrical network (in other words, when the test 131 is not successful (KO)) and with $P_{min}$ corresponding, at initialization, to zero power, then (1334) to the estimation of the power $P'_i$ when the total power is lower than the maximum power given by the voltage generator and when each voltage of each of the at least two dipoles is greater than the threshold voltage of the electrical network (in other words when the test 131 is successful (OK)), and when $P_{max}$ is smaller than the maximum power $P_{bMax}$ that can be given by the recharging terminal i (in other words when the test 1330 is not successful (KO)), and when the difference between the power $P_{max}$ and the power $P_{min}$ is greater than a pre-determined second threshold $\xi_2$ (for example $\xi_2$ equals 5 W) (in other words when the test 1332 is not successful (KO)).

Then, once the available power to be tested $P_{test\_i}$ is updated, it is reutilized for the next iteration of the three steps of estimation 11 (the modified impedance $z'_{ii}$ is recomputed such that $$z'_{ii} = \frac{U r_i^2}{P_{test\_i}}),$$

updating 12 of a voltage of said recharging terminal i and verification and/or updating 13 of the value of the available power.

On the contrary, when the test 131 is successful (OK), a check is made (1330) furthermore on whether $P_{max}=P_{bMax}$ the maximum power capable of being given by the recharging terminal t if it is the case (OK) the available power of initialization is verified (1331) such that $P_{disp\_i}=P_{bMax}$. Else (KO) a verification is made (1332) on whether the difference between $P_{max}$ and $P_{min}$ is below the second pre-determine threshold $\xi_2$ (for example $\xi_2$ is equal 5 W) and if this is the case (OK) the available power is updated (1333) such that $P_{disp\_i}=P_{min}$ or if not, i.e. if $(P_{max}-P_{min})>\xi_2$, $P_{min}=P'_i$ (1334).

5.3 Concrete Example of an Implementation of the Invention

We consider for example an urban electrical lighting network illustrated by FIG. 2 and represented by a cabinet G (or generator) powering firstly the lighting lamps and secondly a recharging terminal for electric vehicles. The cabinet and the lamps are subjected to two electrical constraints: firstly the total power consumed should not exceed a certain maximum level authorized by the cabinet G and secondly the voltage drop at the electric lamps should not go below a minimum value below which the quality of the lighting of the lamps will be degraded.

Thus, during maximum power consumption by the lighting network, a recharging terminal can prove to be electrically unavailable for a certain period (the illumination service being considered to have priority over the recharging service).

The availability of unavailability of a terminal is indicated for example to the user by means of simple signaling system (green or red diodes depending on the availability or unavailability of the terminal respectively).

In order to determine the color of the diode associated with the terminal at a given point in time, the method according to the invention seeks to take account of the arrival of a vehicle and the connection of its battery to the terminal considered. The battery is modeled by a resistive impedance which the method of the invention determines as a function of the power drawn from the terminal. Once this resistive impedance is determined 12, the method according to the invention should, under these conditions, verify 13 whether the constraints of the network are being met or not.

The method according to the invention is implemented at each available terminal and after any electrical change undergone by the network (such as for example the connection/disconnection of the electric vehicle the lighting/extinction of the lamps, variation in the recharging profile of the battery owing to its ageing, etc.). The speed of execution of the method according to the invention is crucial in order to limit the electrical safety margins to the maximum and obtain the utmost benefit of the power available at the terminals.

Such an electrical network is illustrated by FIG. 3 formed by a set of dipoles, impedances $Z_1, \ldots, Z_5$ powered by a generator (or supply cabinet) G of voltage U=220V. It is sought to determine the currents that pass through all the branches of the network (i.e. $i_{12}$, $i_{23}$, $i_{24}$ and $i_{34}$), as well as the voltage potential at each of the nodes 1, 2, 3 and 4 that will be respectively denoted as $V_1$, $V_2$, $V_3$ and $V_4$ ($V_4$ is taken a the reference potential equal to zero).

In a first scenario, the impedance values $Z_2$ and $Z_3$ are considered to represent two recharging terminals which, for the time being, are free (i.e. not connected to electric vehicles). Thus these impedances will have high values modeling an open circuit at the terminals. It must be noted that if an electric vehicle gets connected to one of the terminals, the impedance value will change so as to reflect the power that the vehicle draws from the terminal.

According to the initialization phase 1000, the method of the invention itself determines 1010 the initializing characteristics of the reference configuration at the instant $t_1$.

To this end, starting from the topology illustrated by FIG. 3, a loop impedance matrix $Z_{loop\_R}$ is especially obtained by applying the loop matrix construction technique described in the document "*Graph Theory and Topology For 3 phase Power system under Faulted studies*" (Tedja Santanoe Oepomo, IJRRAS 10(2) February 2012) implementing the construction of five tables specific to the loop of the electrical circuit considered. According to the technique of this document applied to the topology of FIG. 3, we obtain the following tables 1, 2, 3, 4 and 5:

TABLE 1

| 1 | 2 |
|---|---|
| 1 | 4 |
| 2 | 3 |

TABLE 1-continued

| | |
|---|---|
| 2 | 4 |
| 3 | 4 |

TABLE 2

| | |
|---|---|
| 1 | 2 |
| 1 | 4 |
| 2 | 3 |

TABLE 3

| | |
|---|---|
| 2 | 4 |
| 3 | 4 |

TABLE 4

| |
|---|
| 1 |
| 2 |
| 4 |
| 3 |

TABLE 5

| Loop 1: | |
|---|---|
| 2 | 4 |
| 4 | 1 |
| 1 | 2 |
| Loop 2: | |
| 3 | 4 |
| 4 | 1 |
| 1 | 2 |
| 2 | 3 |

From these tables, we deduce the incidence matrix C of the electrical recharging network:

$$C = \begin{pmatrix} 1 & 1 \\ -1 & -1 \\ 0 & 1 \\ 1 & 0 \\ 0 & 1 \end{pmatrix}$$

And therefore the reference loop matrix $Z_{loop\_R}$:

$$Z_{loop\_R} = C^t Z_{bb} C = \begin{pmatrix} Z_1 + Z_2 + Z_4 & Z_1 + Z_4 \\ Z_1 + Z_4 & Z_1 + Z_3 + Z_4 + Z_5 \end{pmatrix}$$

Where $Z_{bb}$=Diag($Z_4, Z_1, Z_5, Z_2, Z_3$), where the order of the impedances corresponds to their order in the table 1 (the first row in table 1 corresponds to the impedance which is found between the nodes 1 and 2 in FIG. 3, the second row corresponds to the one situated between the nodes 1 and 4 etc.).

If we take: $Z_1 = Z_4 = Z_5 = 0.2$ Ω and $Z_2 = Z_3 = 10^9$ Ω (free terminals not connected and corresponding to an open circuit and therefore represented by high value impedances), we will have:

$$Z_{loop\_R} = \begin{pmatrix} 10^9 + 0.4 & 0.4 \\ 0.4 & 10^9 + 0.6 \end{pmatrix}$$

Using a classic matrix inversion method (such as for example the Gauss-Newton inversion), we will have:

$$Z_{loop\_R}^{-1} \approx \begin{pmatrix} 10^{-9} + 0.6*10^{-18} & -0.4*10^{-18} \\ -0.4*10^{-18} & 10^{-9} + 0.4*10^{-18} \end{pmatrix}$$

the currents of the meshes of each loop ($I_{m_1}$ and $I_{m_2}$) are obtained:

$$\begin{bmatrix} I_{m_1} \\ I_{m_2} \end{bmatrix} = Z_{loop\_R}^{-1} \begin{pmatrix} 220 \\ 220 \end{pmatrix} \approx \begin{bmatrix} 220(10^{-9} + 0.2*10^{-18}) \\ 220*10^{-9} \end{bmatrix}$$

Mesh currents ($I_{m_1}$ and $I_{m_2}$) and currents of the incidence matrix C of the electrical recharging network are deduced from the currents in each branch of the network:

$$\begin{pmatrix} i_{12} \\ i_{14} \\ i_{23} \\ i_{24} \\ i_{34} \end{pmatrix} = C \begin{pmatrix} I_{m_1} \\ I_{m_2} \end{pmatrix} \approx 220 \begin{pmatrix} 2*10^{-9} + 0.2*10^{-18} \\ -2*10^{-9} - 0.2*10^{-18} \\ 10^{-9} \\ 10^{-9} + 0.2*10^{-18} \\ 10^{-9} \end{pmatrix}$$

Since there are currents in each branch, the potentials of the nodes $V_1$, $V_2$ et $V_3$ are deduced as follows:

$$V_1 = U + Z_1 i_{14} = 220 - 220*0.2*(2*10^{-9} + 0.2*10^{-18})$$
$$\approx 220V$$

$$V_2 = V_1 - Z_4 i_{12} \approx 220V$$

$$V_3 = V_2 - Z_5 i_{23} \approx 220V$$

Thus, in having impedance values of the electrical circuit and of the voltage U from the generator, the first phase of initialization using classic techniques has made it possible to determine the current in each branch and the voltages of the nodes of the network considered.

Here below, several examples of scenarios are described. Starting from these examples, it is possible to deduce every scenario pertaining to the case where x recharging terminals are used among which p terminals are already busy with electric vehicles or any other type of mobile device to be recharged.

5.3.1 First Scenario: The Network Comprises Two Free Recharging Terminals and it is Sought to Use One of them.

According to this first scenario it is sought to know the available power at the level of each of the terminals while verifying the constraints of the electrical recharging network considered. For example, according to this first scenario, two constraints must be met:
1) Condition C1: the maximum power $P_{gMax}$ that the generator can give is 3100 W
2) Condition C2: the drop in voltage should not fall below a threshold value equal to 214 V. In other words, the potentials of the nodes should be such that $V_1 > 214$, $V_2 > 214$ and $V_3 > 214$.

Besides, according to this example, the maximum power $P_{bMax}$ that a terminal can provide is 3000 W (this value is especially given by the builder of the recharging terminals). However, depending on the user of the electrical network (which can be used both for public lighting and for a recharging function), it can happen that this maximum power is not totally available.

This is why the object of the present invention is to find the power available at each recharging terminal i, denoted $P_{disp\_i}$. It must be noted that $P_{disp\_i}$ belongs to the interval $[0, P_{bMax}]$, the length of which is $P_{bMax}$.

To resolve this problem, at the first iteration, we begin by testing (test 131 successful (OK)) whether the available power to be tested $P_{test\_i} = P_{bMax}$ of initialization is truly available or not. If it is available (1331): $P_{disp\_i} = P_{test\_i} = P_{bMax}$. If not, a method of dichotomy (1322, 1335) is used to halve, at each iteration, the interval to which the available power $P_{disp\_i}$ that is to be determined belongs.

This method consists in testing, at the first iteration, the median value of the interval $[0, P_{bMax}]$, i.e. the value $P_{test\_i} = P_{bMax}/2$: if this power is available, we will have $$P_{disp\_i} \in \left[\frac{P_{bMax}}{2}, P_{bMax}\right]$$

and if not, $$P_{disp\_i} \in \left[0, \frac{P_{bMax}}{2}\right].$$

Let us take the case where $$P_{disp\_i} \in \left[\frac{P_{bMax}}{2}, P_{bMax}\right].$$

Thus, at the second iteration, we test the power value available $$P_{test\_i} = \frac{3 P_{bMax}}{4}:$$

if this power value is available, $$P_{disp\_i} \in \left[\frac{3 P_{bMax}}{4}, P_{bMax}\right]$$

and if not $$P_{disp\_i} \in \left[\frac{P_{bMax}}{2}, \frac{3 P_{bMax}}{4}\right].$$

Thus, at each iteration of the method of dichotomy, the length of the interval to which the available power $P_{disp\_i}$ to be determined belongs is divided by two.

In the same way, several iterations will be implemented until the length of the interval becomes smaller than a certain margin of error ($\xi_1$ (for example $\xi_1$ is equal to 10 W)) that has been accepted for the available power $P_{disp\_i}$.

Besides, testing the availability of power $P_{disp\_2}$ for example at the recharging terminal $Z_2$ (i=2), is equivalent to verifying whether the constraints of the electrical network C1 and C2 are still met when this available power to be tested $P_{test\_2}$ is drawn from the recharging terminal $Z_2$ (i=2).

To this end, the currents in the branches of the electrical recharging network and the voltage potentials (or voltage drops) $V_1$, $V_2$ et $V_3$ must be computed. In order to achieve this, the impedance value $Z_2$ which dissipates an available power to be tested $P_{test\_2}$ must be determined, and then the steps for determining the currents and the voltage drops must be reiterated.

However, determining the value of $Z_2$ consuming available power to be tested $P_{test\_2}$ is not trivial and requires several steps during which $Z_2$ will converge towards its "right" value.

Indeed, $Z_2$ is computed from the equation $Z_2 = V_2^2 / P_{test\_i}$ and the voltage drop $V_2$ is not known in advance (the value of $V_2$ found previously ($\approx$220V) is true only when $Z_2 = 10^9 \Omega$, and not when $Z_2$ dissipates an available power to be tested $P_{test\_2}$).

During a first iteration, the method according to the invention starts with an initial value of $Z_2 = 220^2 / P_{test\_2}$ and determines the voltage drop $V_1$, $V_2$ and $V_3$.

At the next iteration 120, the value $Z_2$ is adjusted 126 from a new value obtained at the previous iteration (122) of $V_2$, and the voltage potentials $V_1$, $V_2$ and $V_3$ are again determined (122) and the operation is continued thus until the power consumed by $Z_2$ becomes fairly close to $P_{test\_2}$.

Thus, at the first iteration, the available power to be tested $P_{test\_2} = P_{bMax} = 3000$ W is first of all evaluated. The corresponding impedance value $Z'_2$ is therefore:

$$Z'_2 = \frac{V_2^2}{P_{test\_2}} = \frac{220^2}{3000} = 16.133 \ \Omega$$

whereas, at the end of the initialization phase, the impedance value of $Z_2$ was $Z_2 = 10^9 \Omega$.

According to the invention, we then determine $Z_{loop\_M}^{-1}$ (16.133) as a function of $Z_{loop\_R}^{-1}$ ($10^9$) (at initialization $Z_2 = Z_3 = 10^9 \Omega$). Using (121) the Sherman-Morrison formula, we obtain:

$$Z_{loop\_M}^{-1}(16.133) = Z_{loop\_R}^{-1}(10^9) - \frac{(16.133 - 10^9) Z_{loop\_R}^{-1}(10^9) l_2^t l_2 Z_{loop\_R}^{-1}(10^9)}{1 + (16.133 - 10^9) l_2 Z_{loop\_R}^{-1}(10^9) l_2^t}$$

Where $l_2$ represents the row vector in the incidence matrix C corresponding to the impedance $Z_2$. In the present case we have: $l_2 = (1, 0)$. In making the computation, we obtain:

$$Z_{loop\_M}^{-1}(16.133) \approx \begin{pmatrix} 0.0604 & -0.02419 * 10^{-9} \\ -0.02419 * 10^{-9} & 10^{-9} \end{pmatrix}$$

The corresponding mesh currents are:

$$\begin{bmatrix} I_{m_1} \\ I_{m_2} \end{bmatrix} = Z_{loop\_M}^{-1} \begin{pmatrix} 220 \\ 220 \end{pmatrix} \approx 220 \begin{bmatrix} 0.0604 - 0.02419 * 10^{-9} \\ 0.97 * 10^{-9} \end{bmatrix}$$

Mesh currents ($I_{m_1}$ et $I_{m_2}$) and the incidence matrix C of the electrical recharging network are deduced from the current in each branch of the network:

$$\begin{pmatrix} i_{12} \\ i_{14} \\ i_{23} \\ i_{24} \\ i_{34} \end{pmatrix} = C \begin{pmatrix} I_{m_1} \\ I_{m_2} \end{pmatrix} \approx 220 \begin{pmatrix} 0.0604 \\ -0.0604 \\ 0.97*10^{-9} \\ 0.0604 \\ 0.97*10^{-9} \end{pmatrix}$$

The corresponding voltage drops are:

$$V_1 = U + Z_1 i_{14} = 220 - 220*0.2*0.0604 \approx 217.34 \text{ V}$$

$$V_2 = V_1 - Z_4 i_{12} \approx 214.684 \text{ V}$$

$$V_3 = V_2 - Z_5 i_{23} \approx 214.684 \text{ V}$$

According to the computation of the voltages, it must be noted that by placing an impedance $Z'_2 = 16,133\Omega$, we obtain a voltage drop $V_2 \approx 214.684$ V (and no longer $V_2 \approx 220$ V as was previously obtained at initialization (1000) when $Z_2 = 10^9 \Omega$). Thus, the power consumed $P'_2$ by $Z'_2 = 16,133\Omega$, is equal to:

$$P'_2 = \frac{V_2^2}{Z'_2} = \frac{214.684^2}{16,133} \approx 2856.8 \text{ W}$$

If we accept a margin of error of 10 W ($\xi_1 = 10$ W) on the power that must be dissipated by the impedance $Z_2$ (i.e. (3000±10) W), the test 125 $|3000 - P'_2| = 143.2 > 10$ W is not successful (KO). It is therefore necessary to again readjust (126) the value of the impedance $Z'_2$.

Thus, for the next iteration, several successive modifications (126) are implemented: the value of the reference impedance $Z_2 = 10^9 \Omega$ coming from the initialization phase is modified so as to be equal to the modified impedance value $Z'_2 = 16,133\Omega$, the value of the reference inverted loop impedance matrix $Z_{loop\_R}^{-1}(10^9)$ is modified so as to be equal to the value of the modified inverted loop impedance matrix $Z_{loop\_M}^{-1}(16,133)$ and the value of the modified impedance called $Z'_2$ which dissipates the available power to be tested $P_{test\_2} = 3000$ W is determined 126 as a function of $V_2$ which has just been obtained during the first iteration:

$$Z'_2 = \frac{V_2^2}{P_{test\_2}} = \frac{214.684^2}{3000} = 15.363 \text{ } \Omega.$$

In other words for the second iteration of the steps (121, 122, 123, 124 and 125) constituting the updating step 12, $Z_2$ of the initialization phase is replaced by $Z'_2$ of the first iteration of these steps, $Z_{loop\_R}^{-1}(10^9)$ is replaced by $Z_{loop\_M}^{-1}(16.133)$, of the first iteration ($Z_{loop\_M}^{-1}$ of the first iteration becomes $Z_{loop\_R}^{-1}$ for the second iteration).

Thus, the "modified" parameters obtained at an iteration become the reference parameters of the following iteration.

Thus, during the second iteration $Z_{loop\_M}^{-1}(15.363)$ is determined (121) as a function of $Z_{loop\_R}^{-1}(16,133)$ (at the end of the preceding iteration ($Z_2 = 16,133\Omega$)) using the Sherman-Morrison formula:

$$Z_{loop\_M}^{-1}(15.363) =$$

$$Z_{loop\_R}^{-1}(16,133) - \frac{(15.363 - 16,133) Z_{loop\_R}^{-1}(16,133) l_2^t l_2 Z_{loop\_R}^{-1}(16,133)}{1 + (16,133 - 10^9) l_2 Z_{loop\_R}^{-1}(16,133) l_2^t}$$

We then obtain:

$$Z_{loop\_M}^{-1}(15.363) \approx \begin{pmatrix} 0.0634 & -0.0253*10^{-9} \\ -0.0253*10^{-9} & 10^{-9} \end{pmatrix}.$$

The corresponding mesh current is:

$$\begin{bmatrix} I_{m_1} \\ I_{m_2} \end{bmatrix} = Z_{loop\_M}^{-1} \begin{pmatrix} 220 \\ 220 \end{pmatrix} \approx 220 \begin{bmatrix} 0.0634 - 0.0253*10^{-9}) \\ 0.97*10^{-9} \end{bmatrix}$$

thus making it possible to deduce the currents in the branches:

$$\begin{pmatrix} i_{12} \\ i_{14} \\ i_{23} \\ i_{24} \\ i_{34} \end{pmatrix} = C \begin{pmatrix} I_{m_1} \\ I_{m_2} \end{pmatrix} \approx 220 \begin{pmatrix} 0.0634 \\ -0.0634 \\ 0.97*10^{-9} \\ 0.0634 \\ 0.97*10^{-9} \end{pmatrix}$$

The corresponding drops in voltages are (122) are:

$$V_1 = U + Z_1 i_{14} = 220 - 220*0.2*0.0634 \approx 217.21 \text{ V}$$

$$V_2 = V_1 - Z_4 i_{12} \approx 214.42 \text{V}$$

$$V_3 = V_2 - Z_5 i_{23} \approx 214.42 \text{ V}$$

Thus the power $P'_2$ consumed by $Z'_2$ is:

$$P'_2 = \frac{V_2^2}{Z'_2} = \frac{214.42^2}{15.363} \approx 2992.66 \text{ W}$$

The test 125 delivers $|3000 - /P'_2| = 7.34$, which is below the margin of error 10 W ($\xi_1 = 10$ W).

Hence, the value $Z'_2 = 15.363\Omega$ is an acceptable estimation of the impedance $Z_2$ which dissipates 3000 W and consumes exactly 2992.66 W.

Having found a correct estimation of the value of the impedance $Z_2$, what remains to be done is to verify 13 the availability of the 3000 W power. In other words it is ascertained that the constraints C1 and C2 are met when the value of the impedance $Z_2$ is $Z'_2 = 15.363\Omega$.

Since $V_1 > 214$, $V_2 > 214$ and $V_3 > 214$, the constraint C2 is met. To verify the constraint C1, it is necessary to compute the total power dissipated by all the impedances and compare it with the maximum power given by the generator; indeed, $$P_T = Z_1 i_{14}^2 + Z_2 i_{24}^2 + Z_3 i_{34}^2 + Z_4 i_{12}^2 + Z_5 i_{23}^2 \approx 0.2*(220*0.0634)^2 +$$
$$3000 + 10^9*(220*0.97*10^{-9})^2 + 0.2*(220*0.0634)^2 +$$
$$0.2*(220*0.97*10^{-9})^2 \approx 3077.81 \text{ W} < P_{gMax} = 3100 \text{ W}$$

Thus, the constraint C1 is also met. Hence the available power to be tested $|P_{test\_2}=3000$ W is available at the impedance $Z_2$. It can be noted that if one of the constraints is not met, the available power to be tested $P_{test\_2}=3000$ W will not be available.

In this case, other power values $P_{test\_2}$ obtained by dichotomy should be tested until we are able to find the maximum power available or more precisely until the length of the interval to which $P_{disp\_2}$ belongs becomes smaller than a certain pre-defined and acceptable margin of error.

Each change in the value of the available power to be tested requires the re-determining of an efficient estimation of the value of the impedance $Z_2$ as described above.

5.3.2 Second Scenario: The Network Comprises a Free Recharging Terminal and a Busy Recharging Terminal, and it is Sought to Use the Free Recharging Terminal According to this scenario, it is assumed that the first scenario has taken place at an instant $t_2$ and that an electric vehicle is connected to the terminal $Z_2$ which, for its part, delivers power of 3000 W.

Besides, it is assumed that the maximum power of the generator is $P_{gMax}$, =4500 W. Thus, the terminal will be modeled by the impedance $Z_2=15.363\Omega$ determined above.

In this case, it is now sought to know what would be the power available at the only remaining free recharging terminal $Z_3$ if it becomes occupied or busy at an instant $t_3$.

It is assumed that the maximum power (given by the builder of the terminals) that can be provided by this second recharging terminal $Z_3$ is 2000 W.

Thus, $P_{disp\_3} \in [0,2000]$, where $P_{disp\_3}$ represents the power available at the free recharging terminal $Z_3$.

As in the case of the first scenario, at the first iteration of the steps of the dynamic determining phase 10 implemented for the recharging terminal $Z_3$, the available power to be tested $P_{test\_3}$ has the maximum value, i.e. 2000 W. As a consequence $$Z_3' = \frac{V_3^2}{P} = \frac{214.42^2}{2000} = 22.98 \ \Omega$$

(whereas, previously, the recharging terminal $Z_3$ was free and therefore $Z_3=10^9\Omega$) and the accurate estimation of the impedance value $Z_2=15.363\Omega$ is kept. It can be noted that the value of $V_3$ corresponds to the value found above $Z_2=15.363\Omega$ and $Z_3=10^9\Omega$.

As in the case of the first scenario, by using (121) the Sherman-Morrison formula, we obtain:

$$Z_{loop\_M}^{-1}(22.98) = Z_{loop\_R}^{-1}(10^9) - \frac{(22.98-10^9)Z_{loop\_R}^{-1}(10^9)l_3^t l_3 Z_{loop\_R}^{-1}(10^9)}{1+(22.98-10^9)l_3 Z_{loop\_R}^{-1}(10^9)l_3^t}$$

Where $l_3=(0,1)$ represents the row vector in the incidence matrix C corresponding to the impedance $Z_3$ And $Z_{loop\_R}^{-1}(10^9)$ the inverse of the loop impedance matrix corresponding to $Z_2=15.363\Omega$ and $Z_3=10^9\Omega$.

In the same way as for the first scenario, the corresponding mesh current ($I_{m_1}$ et $I_{m_2}$), the currents in each branch ($i_{12}$, $i_{14}$, $i_{23}$, $i_{24}$, $i_{34}$) of the network and the corresponding voltage drops $V_1$, $V_2$ and $V_3$ are obtained.

As a consequence, $V_3$ but also $V_2$ can be modified. It is therefore necessary to re-determine the accurate estimations of the impedances $Z_2$ and $Z_3$.

To this end, the method according to the invention proposes to implement several iterations of the steps of the updating step 12 to converge towards a accurate estimation $Z'_3$ of the impedance $Z_3$ dissipating the available power to be tested $P_{test\_3}$. In other words, during these iterations needed for the accurate estimation $Z'_3$ of the impedance $Z_3$, the value of the impedance $Z_2=15.363\Omega$ is kept.

Then, once this value $Z'_3$ is obtained, the accurate estimation $Z'_2$ of the impedance $Z_2$ is relaunched (revised) by means of iterations in order to re-converge as explained above and the process in continued thus.

To determine this new value $Z'_2$, we preserve a constant value of impedance $Z_3=Z'_3$, and the matrix $Z_{loop\_M}^{-1}$ and the other parameters obtained at the end of the obtaining of the value $Z'_3$ are used as reference parameters for this determining of $Z'_2$.

Thus, the determining of the accurate estimation of each impedance $Z_2$ and $Z_3$ is reiterated for each impedance one after the other ($Z_2$ first scenario, $Z'_3$ with fixed value of $Z_2$, $Z'_2$ with fixed value of $Z_3=Z'_3$, $Z''_3$ with fixed value of $Z_2=Z'_2$, $Z''_2$ with fixed value of $Z_3=Z''_3$ . . . ) until we find the impedance values that will enable $Z_2$ to dissipate (3000±10) W and enable $Z_3$ to dissipate the available power to be tested $P_{test\_3}$ (i.e. in such a way that the two tests $|P'_2-P_{test\_2}|<\xi_1$ and $|P'_3-P_{test\_3}|<\xi_1$ are successful). Once the accurate estimations of the impedances $Z_2$ and $Z_3$ are found, we pass to the step 13 of verification and/or updating of $P_{disp\_3}$ according to the dichotomy method referred to above.

In other words, this second iteration adds a new iteration loop to the impedances $Z_2$ and $Z_3$ in addition to the iteration loop (100) of the steps (11, 12, 13) of the method according to the invention and of the iteration loop (120) implemented within the updating step 12 itself.

It must be noted that when the electrical recharging network comprises more than two recharging terminals, for example x>2 among which p<x are occupied, the iterative loop to be added when it is sought to find available power on one of the free terminals is equivalent to determining the p impedances corresponding to the p busy or occupied terminals as well as that of the free terminal in question.

Thus, it can be understood that the method according to the invention implements three imbricated iterative loops in this second scenario.

5.3.3 Third Scenario: The Network Comprises Two Occupied Recharging Terminals, and One of them Will be Released.

According to this third scenario, it is assumed that the recharging terminal of impedance $Z_3$ will become free at an instant $t_4$. To determine the available power $P_{disp\_3}$ at this recharging terminal of impedance $Z_3$ which has become free, it is necessary to recompute the value of the impedance $Z_2$ in this new configuration (the one where the value of $Z_3$ is equal to $10^9$).

In this case, the configuration at the instant $t_3$ is used as a reference configuration and the parameters delivered for it are used as reference parameters to determine the new impedance value $Z_2$ in this new configuration at this instant $t_4$.

Once the accurate estimation $Z'_2$ has been obtained, searching for the available power $P_{disp\_3}$ at the recharging terminal with impedance $Z_3$ brings us exactly to the same solution presented in the second scenario.

5.4 Structure of a Device

Referring now to FIG. 4, we present a simplified structure of a device for determining voltages and/or power available in an electrical recharging network according to one of the embodiments described above.

The electrical recharging network comprises at least one voltage generator and at least two dipoles, of which at least one is an electrical recharging terminal i corresponding, at a first instant $t_1$, to a pre-determined reference impedance $z_{ii}$.

Implemented within a control unit of an electrical recharging network, such a device comprises a memory 41 comprising a buffer memory, a processing unit 42 equipped for example with a microprocessor μP, and driven by the computer program 43 implementing the method for determining voltages and/or power available in an electrical recharging network according to one embodiment of the invention.

At initialization, the code instructions of the computer program 43 are for example loaded into a RAM and then executed by the processor of the processing unit 42. The processing unit 42 receives for example, when the topology of the electrical network is given at input, the impedance values $Ens\_Z_{ii}$ of all the dipoles of the electrical network. The microprocessor of the processing unit 42 implements the steps of the method for determining voltages and/or power available in an electrical recharging network described above according to the instructions of the computer program 43 to determine the available power that can be delivered by each recharging terminal in real time.

To this end, the device for determining voltages and/or power available in an electrical recharging network comprises, in addition to the buffer memory 41, a module 443 for estimating a changing of the reference impedance $z_{ii}$ into a modified impedance $z'_{ii}$, a module 444 for updating a voltage at said recharging terminal I, the updating implementing a step for determining a modified inverted loop impedance matrix $Z_{loop\_M}^{-1}$ as a function of a reference inverted loop impedance matrix $Z_{loop\_R}^{-1}$ and at least as a function of a difference in impedance between the modified impedance $z'_{ii}$ and the reference impedance $z_{ii}$, delivering for the recharging terminal i a modified voltage $U'_i$, a module 445 for verifying and/or updating a value of power, called available power $P_{disp\_i}$, capable of being delivered by said recharging terminal i as a function of said modified voltage $U'_i$, a maximum power given by said voltage generator and/or a threshold voltage of said electrical network, delivering an updated available power in case of updating.

The modules for estimating and updating a voltage, and for verifying and/or updating a value of power, are activated successively at at least a second instant $t_2$ for at least said recharging terminal i by the microprocessor of the processing unit 42.

As an option, the device for determining voltages and/or power available in an electrical recharging network comprises reception module 441 for receiving the reference inverted loop impedance matrix $Z_{loop\_R}^{-1}$ determined or memorized preliminarily or a module 442 for determining this reference inverted loop impedance matrix $Z_{loop\_R}^{-1}$.

The invention claimed is:

1. A method for determining voltages and/or power available in an electrical recharging network, said electrical network comprising at least one voltage generator and at least two dipoles, including at least one recharging terminal i corresponding, at a first instant $t_1$, to a predetermined reference impedance $z_{ii}$, wherein, at at least one second instant $t_2$, said method for determining implements at least one iteration of the following successive steps for at least said recharging terminal i:

estimating a changing of said reference impedance $z_{ii}$ into a modified impedance $z'_{ii}$, updating a voltage of said recharging terminal i, said updating implementing a step of determining a modified inverted loop impedance matrix $Z_{loop\_M}^{-1}$ as a function of a reference inverted loop impedance matrix $Z_{loop\_R}^{-1}$ and at least as a function of an impedance difference between said modified impedance $z'_{ii}$ and said reference impedance $z_{ii}$, delivering a modified voltage $U'_i$ for said recharging terminal i, and verifying and/or updating a value of power, called available power $P_{disp\_i}$, capable of being delivered by said recharging terminal i as a function of said modified voltage $U'_i$, of a maximum power given by said voltage generator and/or of a threshold voltage of said electrical network delivering, in the event of updating, an updated value of available power.

2. The method for determining voltages and/or power in an electrical recharging network according to claim 1, wherein said method for determining voltages and/or power available in an electrical recharging network comprises, at said first instant $t_1$ the following steps of initialization:

determining a topology of said electrical recharging network in the form of an impedance network, each recharging terminal i being represented by said predetermined impedance $z_{ii}$, determining a reference loop impedance matrix $Z_{loop\_R}$ representing said electrical recharging network, for at least said electrical recharging terminal i, determining a value of available power to be tested $P_{test\_i}$, and determining an initialization voltage $U_i$ by inversion of said reference loop impedance matrix $Z_{loop\_R}$ delivering said reference inverted loop impedance matrix $Z_{loop\_R}^{-1}$, memorizing said reference inverted loop impedance matrix $Z_{loop\_R}^{-1}$.

3. The method for determining voltages and/or power in an electrical recharging network according to claim 2, wherein said power available to be tested $P_{test\_i}$ capable of being delivered by said recharging terminal i, corresponds at the first iteration to the maximum power $P_{bMax}$ capable of being provided by said recharging terminal i.

4. The method for determining voltages and/or power in an electrical recharging network according to claim 2, wherein said reference loop impedance matrix $Z_{loop_R}$ corresponds to a matrix product such that:

$$Z_{loop\_R} = C^t * Z_{bb} * C$$

with:

C an incidence matrix of said electrical network obtained from said topology, $Z_{bb}$ a diagonal matrix containing a plurality of impedances, each impedance $z_{ii}$ corresponding to a recharging terminal of said plurality of dipoles.

5. The method for determining voltages and/or power in an electrical recharging network according to claim 4, wherein said step of determining a modified inverted loop impedance matrix $Z_{loop\_M}^{-1}$ uses a Sherman-Morrison type relationship such that:

$$Z_{loop\_M}^{-1} = Z_{loop\_R}^{-1} - \frac{(z'_{ii} - z_{ii})Z_{loop\_R}^{-1} l'_i l_i Z_{loop\_R}^{-1}}{1 + (z'_{ii} - z_{ii}) l_i Z_{loop\_R}^{-1} l'_i}$$

with $l_i$ being a row vector formed by the $i^{th}$ row of said incidence matrix C.

6. The method for determining voltages and/or power available in an electrical recharging network according to claim 1, wherein said step of estimation delivers said modified impedance value $z'_{ii}$ such that $$z'_{ii} = \frac{U_i^2}{P_{test\_i}}.$$

7. The method for determining voltages and/or power available in an electrical recharging network according to claim 2, wherein, for each iteration, said step of updating a voltage of said recharging terminal i implements at least one iteration of the following successive steps:
determining said modified inverted matrix $Z_{loop\_M}^{-1}$ as a function of said reference inverted matrix $Z_{loop\_R}^{-1}$ and of said difference in impedance between said modified impedance $z'_{ii}$ and said reference impedance $z_{ii}$,
determining said modified voltage $U'_i$ from said modified inverted matrix $Z_{loop\_M}^{-1}$,
determining an estimation of power $P'_i$ delivered by the recharging terminal i such that $$P'_i = \frac{U'^2_i}{z'_{ii}},$$

modifying the reference impedance $z_{ii}$ so that it is equal to said modified impedance $z'_{ii}$ delivered by said step of estimation and modifying the value of the reference inverted loop impedance matrix $Z_{loop\_R}^{-1}$ so that it is equal to the value of the modified inverted loop impedance matrix $Z_{loop\_M}^{-1}$, and
comparing, with a first pre-determined threshold, the absolute value of the difference between said estimation of the power $P'_i$ and said available power to be tested $P_{test\_i}$ of said recharging terminal i, and ending said iterations of said successive steps of said step of updating a voltage of said recharging terminal i when said absolute value is lower than said threshold value and if not, for the following iteration of said successive steps of said step of updating of voltage of said recharging terminal i, modifying said modified impedance $z'_{ii}$ such that $$z'_{ii} = \frac{U'^2_i}{P_{test\_i}}.$$

8. The method for determining voltages and/or power available in an electrical recharging network according to claim 2, wherein when a total power value corresponding to the sum of the estimations of power delivered by said at least two dipoles is greater than said maximum power provided by said voltage generator or when a modified voltage $U'_i$ of at least one of said at least two dipoles is smaller than said threshold voltage of said electrical network, said step of verifying and/or updating the value of power available from said recharging terminal i implements a step of updating the value of said available power to be tested $P_{test\_i}$ for the following iteration,
and said step of updating the value of said available power to be tested $P_{test\_i}$ implements a dichotomy such that $$P_{test\_i} = \frac{P_{max} + P_{min}}{2}$$

with $P_{max}$ corresponding, at initialization, to the maximum power $P_{bMax}$ capable of being provided by said recharging terminal i, and then corresponding to said estimation of the power $P'_i$ when a total power corresponding to the sum of the estimations of power delivered by said at least two dipoles is greater than said maximum power provided by said voltage generator or when a modified voltage $U'_i$ of at least one recharging terminal is smaller than said threshold voltage of said electrical network, and $P_{min}$ corresponding at initialization to zero power and then to said estimation of the power $P'_i$ when said total power is smaller than said maximum power given by said voltage generator and when each voltage of each of said at least two dipoles is greater than said threshold voltage of said electrical network and when $P_{max}$ is lower than the maximum power $P_{bMax}$ capable of being provided by said recharging terminal i, and the difference between the power $P_{max}$ and the power $P_{min}$ is greater than a second pre-determined threshold.

9. The method for determining voltages and/or power available in an electrical recharging network according to claim 1, wherein the method further comprises a step of signaling representing said available power, capable of being delivered by said recharging terminal i.

10. A device for determining voltages and/or power available in an electrical recharging network, said electrical network comprising at least one voltage generator and at least two dipoles, including at least one recharging terminal i corresponding, at a first instant $t_1$, to a pre-determined reference impedance $z_{ii}$, wherein said device comprises:
a module which estimates a changing of said reference impedance $z_{ii}$ into a modified impedance $z'_{ii}$,
a module which updates a voltage of said recharging terminal i, said updating implementing a step of determining a modified inverted loop impedance matrix $Z_{loop\_M}^{-1}$ as a function of a reference inverted loop impedance matrix $Z_{loop\_R}^{-1}$ and at least as a function of a difference in impedance between said modified impedance $z'_{ii}$ and said reference impedance $z_{ii}$, delivering a modified voltage $U'_i$ for said recharging terminal i,
a module which verifies and/or updates a value of power, called available power $P_{disp\_i}$, capable of being delivered by said recharging terminal i as a function of said modified voltage $U'_i$, of a maximum power provided by said voltage generator and/or of a threshold voltage of said electrical network delivering, in case of updating, an updated available power,
said modules which estimate, update a voltage and verify and/or update a value of power being activated successively at at least one second instant $t_2$ for at least said recharging terminal i.

11. A non-transitory computer-readable medium comprising a computer program stored thereon comprising instructions to implement a method of determining voltages and/or power available in an electrical recharging network, when this program is executed by a processor, wherein the electrical network comprises at least one voltage generator and at least two dipoles, including at least one recharging terminal i corresponding, at a first instant $t_1$, to a predetermined reference impedance $z_{ii}$, and wherein the method comprises:

at at least one second instant $t_2$, implementing at least one iteration of the following successive steps for at least said recharging terminal i:
estimating a changing of said reference impedance $z_{ii}$ into a modified impedance $z'_{ii}$,
updating a voltage of said recharging terminal i, said updating implementing a step for determining a modified inverted loop impedance matrix $Z_{loop\_M}^{-1}$ as a function of a reference inverted loop impedance matrix $Z_{loop\_R}^{-1}$ and at least as a function of an impedance difference between said modified impedance $z'_{ii}$ and said reference impedance $z_{ii}$, delivering a modified voltage $U'_i$ for said recharging terminal i, and
verifying and/or updating a value of power, called available power $P_{disp\_i}$, capable of being delivered by said recharging terminal i as a function of said modified voltage $U'_i$, of a maximum power given by said voltage generator and/or of a threshold voltage of said electrical network delivering, in the event of updating, an updated value of available power.

\* \* \* \* \*